(12) United States Patent
Zeller

(10) Patent No.: US 11,313,934 B2
(45) Date of Patent: Apr. 26, 2022

(54) METHOD FOR 2D MAGNETIC RESONANCE IMAGING, CORRESPONDING MRI DEVICE, COMPUTER PROGRAM, AND COMPUTER-READABLE STORAGE MEDIUM

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/914,780

(22) Filed: Jun. 29, 2020

(65) Prior Publication Data
US 2021/0003654 A1  Jan. 7, 2021

(30) Foreign Application Priority Data
Jul. 4, 2019 (EP) .................................. 19184389

(51) Int. Cl.
*G01V 3/00* (2006.01)
*G01R 33/565* (2006.01)
*G01R 33/48* (2006.01)
*G01R 33/561* (2006.01)

(52) U.S. Cl.
CPC ... *G01R 33/56545* (2013.01); *G01R 33/4818* (2013.01); *G01R 33/4828* (2013.01); *G01R 33/5611* (2013.01)

(58) Field of Classification Search
CPC .............. G01R 33/543; G01R 33/5659; G01R 33/3415; G01R 33/36; A61B 5/055
USPC ........................................................ 309/324
See application file for complete search history.

(56) References Cited

U.S. PATENT DOCUMENTS

| 9,841,481 | B2 | 12/2017 | Kerr | |
|---|---|---|---|---|
| 2010/0026294 | A1* | 2/2010 | Lustig | G01R 33/5616 324/307 |
| 2013/0271131 | A1* | 10/2013 | Duerk | G01R 33/4824 324/309 |

(Continued)

OTHER PUBLICATIONS

"Questions and answers in MRI—Compressed Sensing", http://mriquestions.com/compressed-sensing.html, accessed on Jul. 8, 2019.

(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

The present disclosure relates to a method and a magnetic resonance imaging device for two-dimensional (2D) magnetic resonance (MR) imaging of a subject. The disclosure further relates to a corresponding computer program and a corresponding computer-readable storage medium. In one exemplary method, a k-space dataset of the subject is acquired using a simultaneous multi-slice technique. Therein, a blipped phase-encoding gradient is applied in a pseudo-random manner to achieve an incoherent undersampling at least in a k-space direction perpendicular to a slice select direction. A compressed sensing reconstruction is then performed based on the acquired k-space dataset to generate an MR image of the subject.

11 Claims, 3 Drawing Sheets

(56) References Cited

U.S. PATENT DOCUMENTS

| | | | | |
|---|---|---|---|---|
| 2013/0320973 A1* | 12/2013 | Fenchel | ................ | A61B 5/7285 |
| | | | | 324/309 |
| 2015/0301145 A1 | 10/2015 | Kerr | | |
| 2016/0341807 A1 | 11/2016 | Bilgic | | |
| 2017/0097400 A1* | 4/2017 | Nakai | ................ | G01R 33/4828 |
| 2018/0299524 A1* | 10/2018 | Feiweier | ............ | G01R 33/5611 |
| 2018/0306880 A1 | 10/2018 | Salerno | | |
| 2018/0306881 A1* | 10/2018 | Tamada | ................ | G01R 33/54 |
| 2018/0348323 A1 | 12/2018 | Carinci | | |

OTHER PUBLICATIONS

European Search Report for European Application No. 19184389. 5-1010 dated Jan. 23, 2020.

Lustig, M., and J. Pauly. "Compressive chemical-shift-based rapid fat/water imaging." Proceedings of the 17th Annual Meeting of ISMRM, Honolulu, Hawaii. 2009. pp. 2646.

Lustig, M., D. L. Donoho, and J. M. Pauly. "Multi-slice compressed sensing imaging." International Society for Magnetic Resonance in Medicine. vol. 15. 2007. pp. 828.

Wang, Haifeng, Dong Liang, and Leslie Ying. "Pseudo 2D random sampling for compressed sensing MRI." 2009 Annual International Conference of the IEEE Engineering in Medicine and Biology Society. IEEE, 2009. pp. 2672-2675.

Zhu, Kangrong, et al. "Multislice acquisition with incoherent aliasing (MICA)." Proc 22nd Annu. Meeting. 2014. Abstract 4403.

* cited by examiner

2 Magnetic resonance imaging device
3 Patient
4 Imaging system
5 Data processing device
6 Processor
7 Memory
8 Monitor (State of the art)

METHOD FOR 2D MAGNETIC RESONANCE IMAGING, CORRESPONDING MRI DEVICE, COMPUTER PROGRAM, AND COMPUTER-READABLE STORAGE MEDIUM

The present patent document claims the benefit of European Patent Application No. 19184389.5, filed Jul. 4, 2019, which is hereby incorporated by reference.

TECHNICAL FIELD

The present disclosure refers to a method for two-dimensional (2D) magnetic resonance imaging (MRI), a corresponding MRI device, a computer program, and a computer-readable storage medium.

BACKGROUND

Even though magnetic resonance (MR) imaging, or MRI for short, is an established technique to create images of subjects such as patients, development of further improvements is still ongoing. One aim is to reduce acquisition time of MRI data to reduce stress for respective patients.

One avenue for reducing the acquisition time lies in the relatively recently developed compressed sensing technique, which refers to a group of methods for accelerated MR data acquisition based on pseudo- or semi-random, incomplete sampling of k-space. For slice-wise 2D MR-imaging, the possibilities to create a random sampling are, however, very limited. In "Pseudo 2D Random Sampling for Compressed sensing MRI" by H. Wang, D. Liang, and L. Ying, published in Conference Proceedings Annual International Conference of the IEEE Engineering in Medicine and Biology Society, September 2009, it is proposed to achieve the required incoherence by switching a phase-encoding direction by 90° during data acquisition. In practical applications, however, this method is difficult to implement, because the phase-encoding direction may be a direction of minimal body extent of a respective subject to reduce certain artefacts. Consequently, rotating the phase-encoding direction may in many cases lead to artefacts, such as flow artefacts, in resulting MR images which is obviously an undesirable result.

SUMMARY AND DESCRIPTION

It is an object of the present disclosure to enable a reduction in acquisition time in magnetic resonance imaging.

The scope of the present disclosure is defined solely by the appended claims and is not affected to any degree by the statements within this summary. The present embodiments may obviate one or more of the drawbacks or limitations in the related art.

A method according to the present disclosure is configured for 2D magnetic resonance imaging of a subject, such as a patient or a part of a patient. One act of this method includes acquiring an undersampled k-space dataset for or of the respective subject using a simultaneous multi-slice technique (SMS MRI). Therein, to achieve an incoherent undersampling in at least one k-space direction, (e.g., the $k_z$-direction), an encoding for selecting the respective k-space points to be sampled for the k-space dataset is created. This is achieved by applying a blipped phase-encoding gradient in a slice direction in a pseudo-random manner and/or by pseudo-randomly imposing or impressing a phase on excitation-RF-pulses that are used in acquiring the k-space dataset, e.g., played out during the respective data- or image-acquisition. In any case, a pseudo-random phase variation is generated for or as the $k_z$-encoding. In SMS MRI, the acquisition of the k-space dataset may be seen as filling a multidimensional, (e.g., 3-dimensional), k-space or k-space matrix, wherein the imposing or impression of a phase by either of the above-mentioned methods may be interpreted as a shift in the respective k-space direction or dimension, (e.g., the $k_z$-direction). In another act of the method, a compressed sensing (CS) reconstruction is performed based on the acquired undersampled k-space dataset to generate an MR image or a set of MR images of the respective subject.

The compressed sensing reconstruction may exploit a sparsity of a signal to recover it from fewer samples than required by the Nyquist sampling theorem. The compressed sensing reconstruction may include an iterative optimization process using non-linear Fourier transformation. The compressed sensing reconstruction may include thresholding of intermediate reconstructed images. In other words, because it is known that traditional MR images may be compressed after reconstruction, it may be possible to only acquire a limited dataset in the first place that allows for a reconstruction of an MR image with an image quality that is at least comparable to that of a compressed traditional MR image. To accomplish this, an incoherent undersampling, a sparsifying transformation, and an iterative reconstruction process may be required.

Undersampling means that only a portion of the full k-space is measured, which allows for a significant reduction in data acquisition time. Undersampling may refer to a sampling rate that is below the Nyquist sampling rate. In certain examples, the k-space is fully sampled when the Nyquist sampling theorem is meet. Partial data acquisition schemes such as sampling or measuring only every second k-space point or k-space line may be inadvisable, because such a coherent or predictable sampling pattern may create unwanted ghost artefacts. In contrast, the undersampling for the present method is performed in an incoherent, (e.g., pseudo-random or semi-random), manner. This avoids the ghost artefacts and instead distributes a diffuse noise across the entire firstly reconstructed image. This noise may then be removed or reduced as part of the compressed sensing reconstruction.

Sparsity refers to an extent or degree to which a matrix, (e.g., a k-space matrix partly filled with the acquired k-space dataset), is filled with meaningful or non-zero data. Even if the initial k-space matrix or k-space dataset is not sparse, this may be achieved by applying a sparsifying transform, for example, based on wavelets.

For the iterative reconstruction process, and initial image may be created from the original acquired k-space dataset. This initial image may contain the mentioned diffuse noise. Then, a sparsifying transform, such as wavelet decomposition, is applied to concentrate meaningful image characteristics into a reduced number of relatively high-intensity pixels. The diffuse noise may then be of lower intensity and distributed over many pixels, mostly in an image background. Next, a denoising act may be performed, e.g., by zeroing out pixels with values below a predetermined threshold, by digital filtering, and/or a subtraction.

To a resulting sparsified dataset, the inverse of the sparsifying transform and an inverse Fourier transform is applied to convert the denoised image-space data back into k-space data. The original k-space matrix or k-space dataset and the denoised k-space data may then be subtracted from each other to generate a difference k-space matrix or difference k-space dataset. The latter is then Fourier transformed into a corresponding difference image that is then compared to the initial image. The initial image and the difference image may then be added together to generate an updated or intermediate image.

If a comparison between the initial image and the respective updated intermediate image shows a significant disparity or difference, (e.g., a difference greater than a predetermined threshold), then another iteration is performed, starting with applying the sparsifying transform to the respective updated or intermediate image that is in this iteration then used instead of the initial image. If no significant disparity or difference is detected in the last act of one iteration, the respective updated or intermediate image is used as a final reconstructed MR image.

Simultaneous multi-slice (SMS) MRI is a method or technique, wherein multiple slices of the respective subject are simultaneously excited or stimulated using a single RF pulse. This technique may lead to a reduction of total acquisition time. There are, however, limitations in an achievable reduction of acquisition time, in particular for Rapid Acquisition with Refocused Echoes (RARE) techniques, such as Turbo Spin Echo (TSE) imaging, which include a bulk of routinely performed measurements. For example, a possible reduction or variation of a repetition time TR may lead to variations in an image contrast when using TSE-imaging, which may be unwanted in practical or clinical imaging applications.

The presently proposed combination of an SMS imaging technique with a compressed sensing reconstruction advantageously enables a further reduction in acquisition time, in particular for 2D TSE-based MR-imaging without introducing the mentioned image contrast variations or ghost artefacts. This is mainly the case, because of the possibility of acquiring or sampling the k-space dataset with an increased incoherence, for example, by at least pseudo-randomly reducing a number of echo trains. This means that even in scenarios where the repetition time TR cannot be reduced an effective reduction in total acquisition time may be achieved without a significant reduction of image quality.

A blipped phase-encoding gradient may refer to an intermittent application of that gradient or gradient field. This means that there may be multiple times or instances where the blipped phase-encoding gradient is applied or turned on, (e.g., active), and these times or instances are interrupted by times where the phase-encoding gradient is not applied, (e.g., turned off or inactive). The blipped phase-encoding gradient may therefore also be regarded as a slow gradient as opposed to fast gradients that may be continually applied with switching directions or polarities. The fast gradients also move through points of zero intensity. The zero points are arbitrarily short, while the zero- or off-times between individual applications or activations, (e.g., between individual blips of the slow blipped phase-encoding gradient), are extended periods of time, each of which may be at least on the same time-scale as or even longer than an individual blip or activation time of the blipped phase-encoding gradient. The blipped phase-encoding gradient may advance a sampling position with each application, e.g., with each blip, such as in the $k_y$-direction or along the $k_y$-axis.

In an advantageous development, a sampling probability for k-space points in a central portion or central region of the k-space is higher than for k-space points in or closer to a k-space periphery as a boundary condition for the incoherent, e.g., pseudo-random undersampling. A corresponding pseudo-random sampling pattern may, in other words, be density-weighted with higher weights and therefore a higher density of sampling points at or near to the k-space center compared to the k-space periphery. This is particularly advantageous, because the central region of k-space may include important information for the final MR image than the k-space periphery. Therefore, employing the incoherent undersampling while simultaneously providing that at or near the k-space center more k-space points are measured then further towards the periphery may result in an optimal compromise between the desired randomness or incoherence and the quality or importance of the actually sampled or measured, e.g., acquired k-space dataset. Consequently, the proposed approach may lead to an optimal image quality of the resulting MR image while simultaneously reducing acquisition time compared to the state of the art. For a practical application, the boundary condition may be applied by including a predetermined density-function with predetermined weights in a function or algorithm for generating the pseudo-random sampling pattern.

In a further advantageous development, the k-space dataset is acquired using a GeneRalised Auto calibrating Partial Parallel Acquisition (GRAPPA) technique for parallel imaging. Therein, the k-space data of the k-space points in the central portion or region of the k-space is used as reference data. The current parallel imaging techniques for accelerated imaging, such as GRAPPA, may require a fully encoded reference dataset, for example, to estimate a spatial coil sensitivity. In traditional approaches this reference data is acquired separately from the respective k-space data for the actual MR image using a separate sequence. This obviously requires additional acquisition time. The additional acquisition time for the reference data may be avoided using the presently proposed approach based on the insight that due to the higher sampling probability or higher sampling density in the central region of the k-space corresponding k-space data may be good enough, e.g., complete enough to use as the reference data for the GRAPPA technique. This may apply to slice-GRAPPA as well and to in-plain-GRAPPA reconstruction techniques. Consequently, a total measurement time or data acquisition time may be further reduced to advantageously decrease stress for the respective subject even more.

In an advantageous development, the blipped phase-encoding gradient is also varied in the slice- or slice-select-direction within each echo train so that different echoes in a specific echo train may sample k-space points from different coordinates in or along the at least one k-space direction, e.g. from different $k_z$-coordinates. Therein, as a boundary condition for the incoherent undersampling it is provided that the k-space center is sampled at a same relative time within all of the echo trains. By varying or pseudo-randomizing the imposed or impressed phase for each echo train a greater incoherence may be achieved, advantageously aiding the compressed sensing reconstruction. On the other hand, varying or pseudo-randomizing the imposed or impressed phase in each echo train so that the k-space center is sampled at the same relative time has the advantage of providing that a wanted predetermined image contrast is actually achieved, which may advantageously reduce artefacts or unwanted variations in the resulting MR images. As described above, the boundary condition may be applied as a predetermined factor or requirement for a function or algorithm that may be used to generate the incoherent sampling pattern for acquiring the k-space dataset.

In a further advantageous development, different numbers of sampled k-space points are allowed for different coordinates in or of the at least one k-space direction, e.g., for different $k_z$-coordinates in the incoherent undersampling, such as in the incoherent acquisition of the k-space dataset. In other words, there is no boundary condition requiring that, for each slice, (e.g., for every $k_z$-coordinate), a respective total number of sampling points must be the same. This may advantageously further increase the total incoherence or pseudo-randomness of the k-space dataset. This in turn may advantageously improve a performance of the compressed sensing reconstruction, ultimately resulting in an improved image quality of the final MR image.

In an advantageous development, multiple different image contrasts are acquired and the undersampling is also incoherently performed in a corresponding additional sampling dimension that depends on the types of the different contrasts. Different image contrasts in this sense may be T1, T2, inversion recovery, proton-density (pd), and the like. Acquisition of such different image contrasts advantageously enables reconstruction of corresponding differently weighted MR images, which may show different details or yield different insights for improved diagnostics. The proposed method of a pseudo-randomized sampling scheme may be applied with particular advantage when acquiring multiple different image contrasts. This is the case, because when acquiring multiple image contrasts, a corresponding additional dimension is spanned, and the incoherence may also be applied in this dimension which aids the compressed sensing reconstruction. Additionally, the additional dimension also means that a sparsity of the acquired k-space dataset is increased, which is also beneficial for the compressed sensing reconstruction. Examples for the different contrasts and the corresponding additional sampling dimension are given below.

In a further advantageous development, the echo time is used as the additional sampling dimension so that echo times are at least pseudo-randomized across the acquisitions of the different image contrasts. In other words, a mapping-method, such as T2-mapping or multi-parameter-mapping may be used. Here, a respective time at which a central k-space echo is measured within a respective echo train may be varied to increase overall incoherence. This may advantageously result in reduced artefacts in the final MR image.

In a further advantageous development, a Dixon technique, such as a 2-, 3-, or multipoint-Dixon imaging method, is used. The additional sampling dimension is spanned by a phase state of different signals so that differently pseudo-randomized sampling patterns are used for in-phase and out-of-phase echoes. Dixon techniques capitalize on chemical shift differences between different molecules such as fat and water and use the in-phase/out-of-phase cycling of these different molecules. For example, two sets of spin echoes may be acquired with slightly different echo times, a first set with, for example, fat and water signals in phase at a center of the echo and a second set with the echo time varied or adjusted, for example, by a few milliseconds so that fat and water signals are out of phase. An underlying idea here is that the corresponding in-phase and out-of-phase images may be combined so that, for example, fat-only and water-only MR images may be created. By using at least partially different sampling points or k-space points for the in-phase echoes and the out-of-phase or opposed phase echoes incoherence may be achieved in this additional dimension, thereby increasing the overall total incoherence, which again may benefit the compressed sensing reconstruction and result in an improved image quality of the final MR image.

The different sampling patterns for the in-phase and the out-of-phase echoes may be used or at least differ from each other in the k-space periphery. In a central region of the k-space, the sampling density might as described be increased to the point where every k-space point in the central region is sampled, meaning that effectively the same complete sampling pattern may be used for both types of echoes in the central k-space region. Differing sampling patterns in the k-space periphery may, however, still be advantageous.

Another aspect of the present disclosure is a magnetic resonance imaging device (MRI device), including an imaging system for acquiring k-space data of or for a subject, and further including a device or system (e.g., a processor) for processing the acquired k-space data. The magnetic resonance imaging device is configured to, in particular automatically or semi-automatically, execute or carry out at least one embodiment of the method. The imaging system may include state-of-the-art components such as magnets, a signal generator, an amplifier, measurement or signal detection electronics, a data store, a processor connected therewith, and/or the like.

Another aspect of the present disclosure is a computer program including instructions to cause the magnetic resonance imaging device to execute or carry out at least one embodiment of the method. The method may be a computer-implemented method in form of the computer program according to the present disclosure. This computer program may then be executed by a processor of the magnetic resonance imaging device or a computer or data processing device directly or indirectly connected to a magnetic resonance imaging device and/or including an interface over which the acquired undersampled k-space dataset is provided. The computer program may include additional instructions and/or parts, for example, to interface with additional software and/or hardware modules, to capture user input, to provide a user interface (GUI), and/or the like.

Another aspect of the present disclosure is a computer-readable storage medium having a computer program stored thereon in at least one embodiment.

The magnetic resonance imaging device may be configured to execute the method by including or being provided with a computer-readable storage medium, which may in particular be connected to a processor of the magnetic resonance imaging device.

The embodiments and developments described herein for at least one aspect of the present disclosure, that is, at least for the method, the magnetic resonance imaging device, the computer program, and the computer-readable storage medium, as well as the corresponding advantages may be applied to any and all aspects of the present disclosure.

BRIEF DESCRIPTION OF THE DRAWINGS

Further advantages, features, and details of the present disclosure derive from the following description of embodiments as well as from the drawings. The features and feature combinations previously mentioned in the description as well as the features and feature combinations mentioned in the following description of the figures and/or shown in the figures alone may be employed not only in the respectively indicated combination but also in other combinations or taken alone without leaving the scope of the present disclosure. In the drawings.

DETAILED DESCRIPTION

The examples described below refer to embodiments of the present disclosure. Therein, individual components and process acts of the embodiments each constitute individual, independent features of the present disclosure that may further develop the disclosure independently of each other as well as in combinations not explicitly described. The described embodiments may be further developed or supplemented by features, components, and/or acts already described above.

In the figures, features that are the same, functionally the same, or correspond to each other are indicated by the same reference signs.

Figure 1:
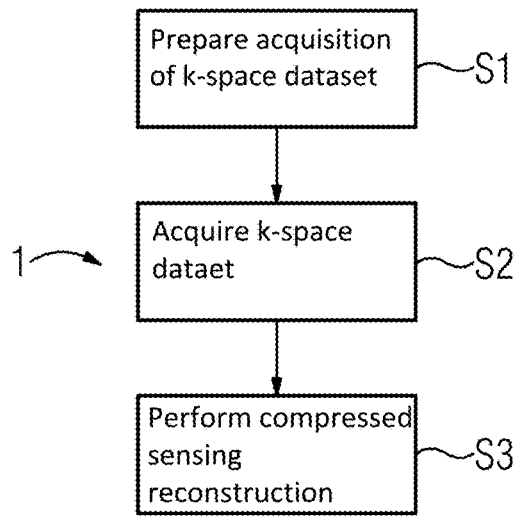
FIG. 1 schematically depicts an exemplary flow chart for a magnetic resonance imaging method.

FIG. 1 schematically shows an exemplary flow chart 1 for a magnetic resonance imaging method with process acts S1, S2, and S3. This method will be described with reference to the other figures and may, for example, be carried out using a magnetic resonance imaging device, such as the MRI device 2 schematically shown in FIG. 2.

Figure 2:
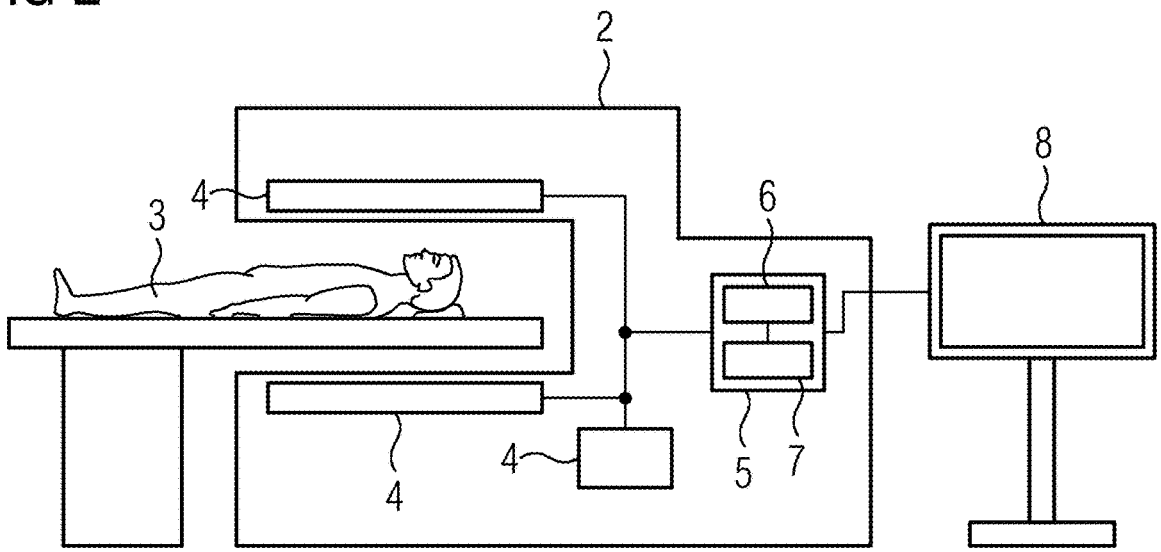
FIG. 2 schematically depicts an example of a magnetic resonance imaging device for carrying out the method.

In FIG. 2, the MRI device 2 is presently used for imaging a patient 3. For this purpose, the MRI device 2 includes an imaging system 4 that is only hinted at schematically but may include multiple different magnets as well as a signal generator for generating RF-pulses to excite multiple slices of the patient 3 at once. The MRI device 2 further includes a data processing device 5. The data processing device 5 itself includes at least a processor 6 and connected thereto to a memory 7 on which a computer program is stored. This computer program implements at least some of the process acts S1, S2, and S3 indicated in FIG. 1. Correspondingly, these process acts may represent functions or modules of the computer program.

Additionally, a monitor 8 is provided as part of the MRI device 2 or connected thereto. The monitor 8 may be used to output MRI images generated by the MRI device 2 in general or by the data processing device 5 specifically.

The presently described magnetic resonance imaging method aims at further reducing a total required acquisition time over the state of the art. Conventional 2D MRI imaging methods, such as TSE, up to now allow only for an undersampling in one phase-encoding direction which severely limits the possibilities for generating an incoherently undersampled k-space dataset. Combined with a requirement of constant repetition times to achieve the desired image contrast, the possibilities for a reduction in acquisition time are very limited even when using an SMS technique.

In FIG. 1, in process act S1, the acquisition of the k-space dataset is prepared. This may include automatically or manually selecting slices of the patient to be imaged, selecting an acquisition method or sequence to be used, and generating a pseudo-randomized sampling pattern.

In process act S2, the k-space dataset is acquired using the pseudo-randomized sampling pattern with incoherent undersampling.

In process act S3, a compressed sensing reconstruction is performed based on the acquired k-space dataset. If applicable, a GRAPPA reconstruction may be performed here as well using calibration k-space data from a densely or even completely sampled central k-space region 25 (see FIG. 6) as reference data, for example, to estimate coil sensitivities of multiple coils that might have been used in process act S2 for parallel imaging. In process act S3, using the compressed sensing reconstruction a final MR image of the patient 3 is generated. This final MR image may then be stored on the memory 7 and/or output to the monitor 8, and/or to another device or software over a corresponding interface.

As described above for successful execution of the compressed sensing reconstruction, the k-space may be incoherently undersampled and the acquired k-space dataset may be transformable into a sparse representation, for example, using a wavelet-transform. While the latter is possible, the possibilities for incoherent undersampling may be dependent on a type of the used acquisition method or sequence. For example, it may be easier to achieve an undersampling with sufficient incoherence for a multi-dimensional base dataset. Suitable examples include time resolved datasets such as GRASP-VIBE or CS Cardiac CINE, 3D-datasets like CS SPACE, and datasets with an additional encoded k-space dimension, such as CS SEMAC.

With reference to FIGS. 3 to 7, additional details regarding the incoherent sampling or acquisition of the k-space dataset will now be described.

Figure 3:
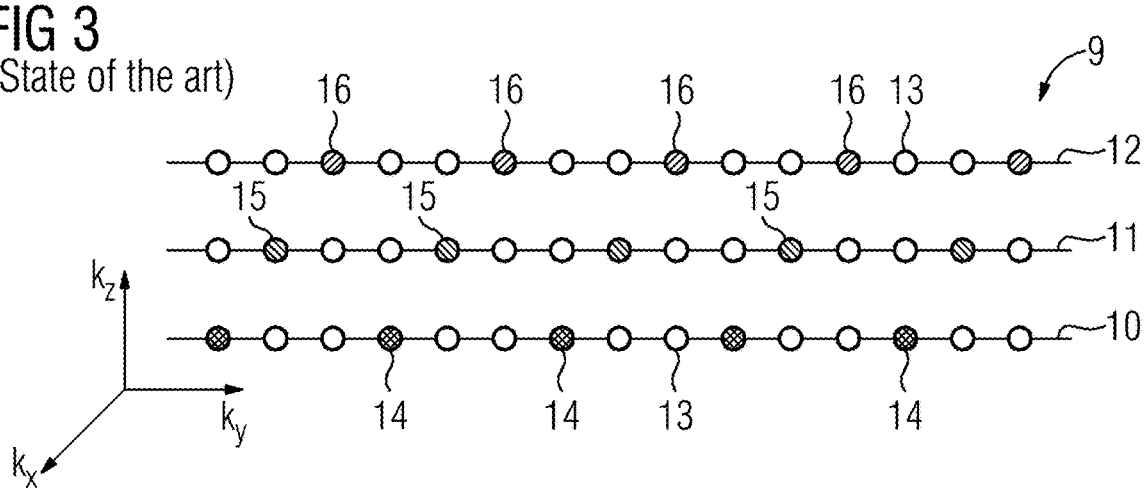
FIG. 3 illustrates a state-of-the-art SMS sampling scheme.

FIG. 3 schematically illustrates a conventional sampling scheme 9 for a blipped CAIPIRINHA method (controlled aliasing in parallel imaging results in higher acceleration). CAIPIRINHA is a parallel imaging technique using a group of unique k-space sampling patterns to reduce pixel aliasing and overlap on reconstructed images. Therein, acquired points in k-space are shifted from one another by applying additional offsets to the phase-encoding gradient tables. SMS MRI with blipped CAIPIRINHA may be seen as filling a three-dimensional k-space, wherein an application or impression of a phase by a gradient in slice direction $k_z$ or an application or impression of a phase onto an RF-pulse may be interpreted as a shift in the $k_z$-direction.

In FIG. 3, as well as the following figures, three sets of k-space points, namely a first set 10, a second set 11, and a third set 12 are shown. Not all of these k-space points 13 are actually measured or sampled. Rather, a partial but coherent regular sampling pattern is used, including a first echo train 14 on the first set 10, a second echo train 15 on the second set 11, and a third echo train 16 on the third set 12. Each of the echo trains 14, 15, 16 includes multiple regularly spaced k-space points 13. In FIG. 3, the echo trains 14, 15, 16 show the same spacing, the same number of sampled k-space points 13 per echo train 14, 15, 16, and the same number of sampled k-space points 13 for each slice or $k_z$-coordinate, that is, for each of the sets 10, 11, 12.

For the sake of clarity and readability only some of the k-space points 13 and some of the sampled points are indicated.

Figure 4:
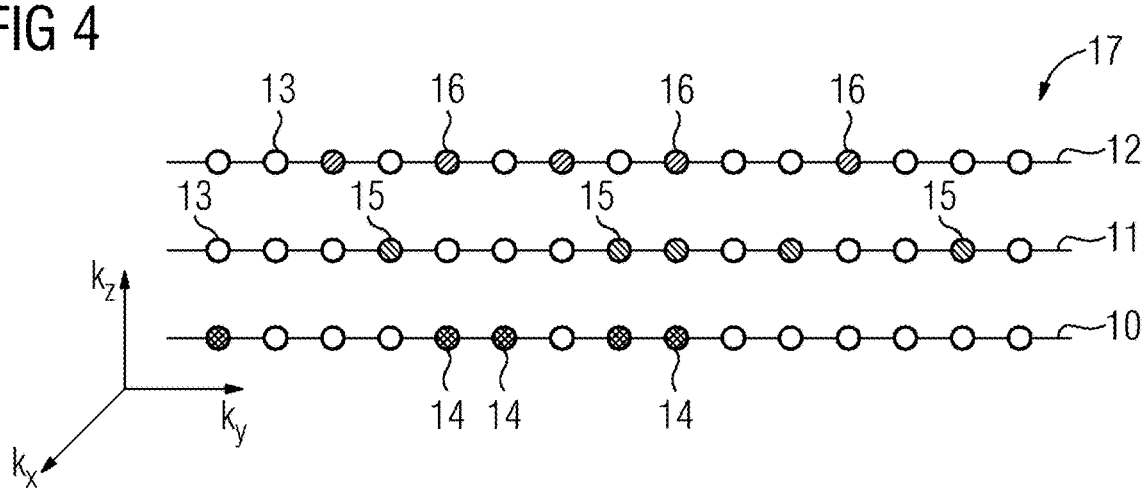
FIG. 4 illustrates an example of a randomized SMS sampling scheme.

Other than shown in FIG. 3, a pseudo-randomized incoherent sampling pattern may be used for the presently proposed magnetic resonance imaging method that may combine an incoherent undersampling with the described compressed sensing reconstruction for 2D SMS MRI. For example, FIG. 4 illustrates a randomized sampling scheme 17 with varying density, e.g., with randomized or pseudo-randomized spacing between the actually sampled k-space points 13 in each of the echo trains 14, 15, 16. The randomized sampling scheme 17 advantageously introduces randomness or incoherence, which enables a successful execution of the compressed sensing reconstruction. At the same time, the random sampling scheme, 17 may be relatively easily implemented and executed. Because a respective applied phase, (e.g., imposed or impressed phase), may be the same for each of the echo trains 14, 15, 16, this may result in different weighting of the k-space center 19 (see FIG. 5) within the different echo trains 14, 15, 16. Also, the (pseudo-)randomness of the random sampling scheme 17 may be limited by the boundary condition that for each $k_z$-coordinate the same total number of k-space points 13 is sampled or measured, because all of the echo trains 14, 15, 16 may have to include the same number of recorded echoes.

Figure 5:
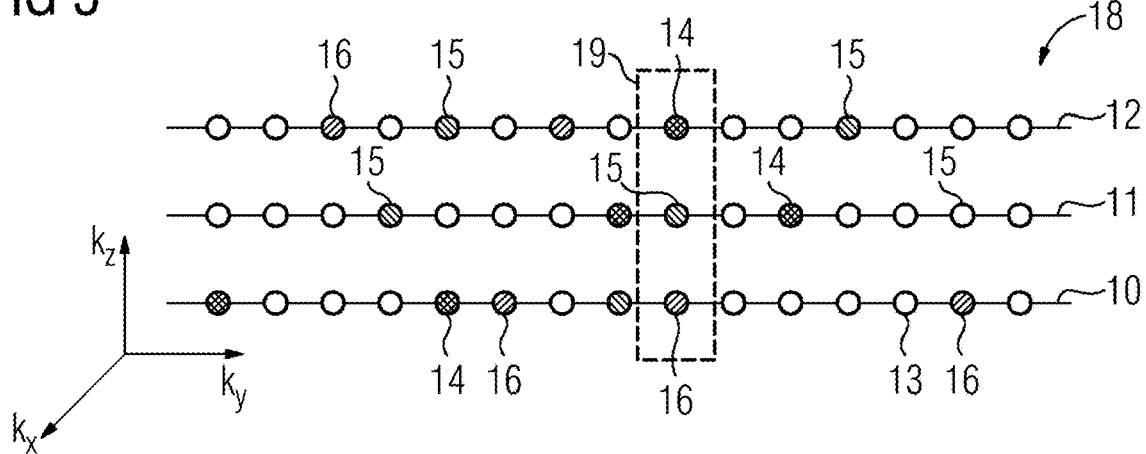
FIG. 5 illustrates an example of an improved randomized SMS sampling scheme.

FIG. 5 schematically illustrates a double randomized sampling scheme 18 that may be used to further improve the proposed method. Therein, a respective imposed or impressed phase within each of the echo trains 14, 15, 16 is varied so that the k-space center 19 is sampled at a same relative point in time within each of the echo trains 14, 15, 16. Also, the double randomized sampling scheme 18 is not limited by the boundary condition that for each $k_z$-coordinate the same number of k-space points 13 must be sampled, which advantageously further increases the overall incoherence and thus the performance of the compressed sensing reconstruction. Because the double randomized sampling scheme 18 introduces a variation or randomness in terms of the $k_z$-coordinate within each of the echo trains 14, 15, 16, each of the sets 10, 11, 12 may be sampled by multiple ones of the echo trains 14, 15, 16. This may result in different numbers of sampled k-space points 13 for the sets 10, 11, 12.

Figure 6:
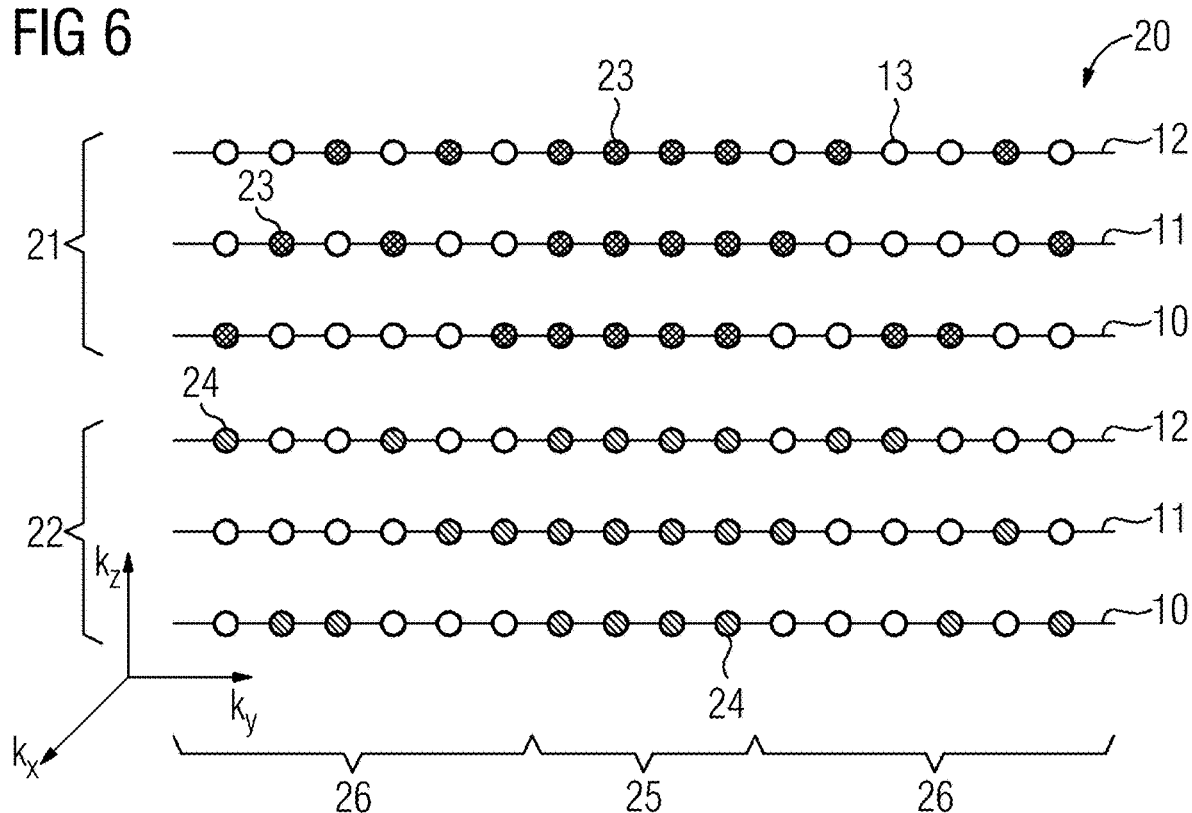
FIG. 6 illustrates an example of a randomized sampling scheme for the Dixon sampling technique.

It may be particularly advantageous to combine an incoherent undersampling with an acquisition of multiple image contrasts. This may mean that a mapping-method, such as T2-mapping or multi-parameter-mapping as in the known MDME-sequence (multi-delay multi-echo), or a multipoint-Dixon-imaging method may be used. In these methods, an additional dimension for the compressed sensing reconstruction is spanned, which may advantageously increase a sparsity of the k-space dataset. As an example, FIG. 6 schematically illustrates a randomized Dixon sampling scheme 20, wherein at least partially different ones of the k-space points 13 are sampled for in-phase echoes 21 than for out-of-phase echoes 22. It may clearly be seen that sampled in-phase points 23 are differently distributed than sampled out-of-phase points 24. Therefore, an additional randomness or incoherence is introduced in the additional phase state dimension. To improve clarity and readability only some of the sampled in-phase points 23 and only some of the sampled out-of-phase points 24 are indicated and both are shown homogeneously but may in practice be acquired through multiple echo trains similarly to the echo trains 14, 15, 16 indicated in FIGS. 3-5.

It is also visible that the sampled points 23, 24 are not distributed completely randomly. Rather, a density-weighted distribution is used, meaning that a probability-distribution describing whether or not one of the k-space points 13 is actually sampled prioritizes or emphasizes the central k-space region 25 over the k-space periphery 26. Correspondingly, k-space points 13 in the central k-space reached 25 may be fully or almost fully sampled. This advantageously also opens up the possibility to use k-space data from the central k-space region 25 as reference data for use in a GRAPPA technique.

Figure 7:
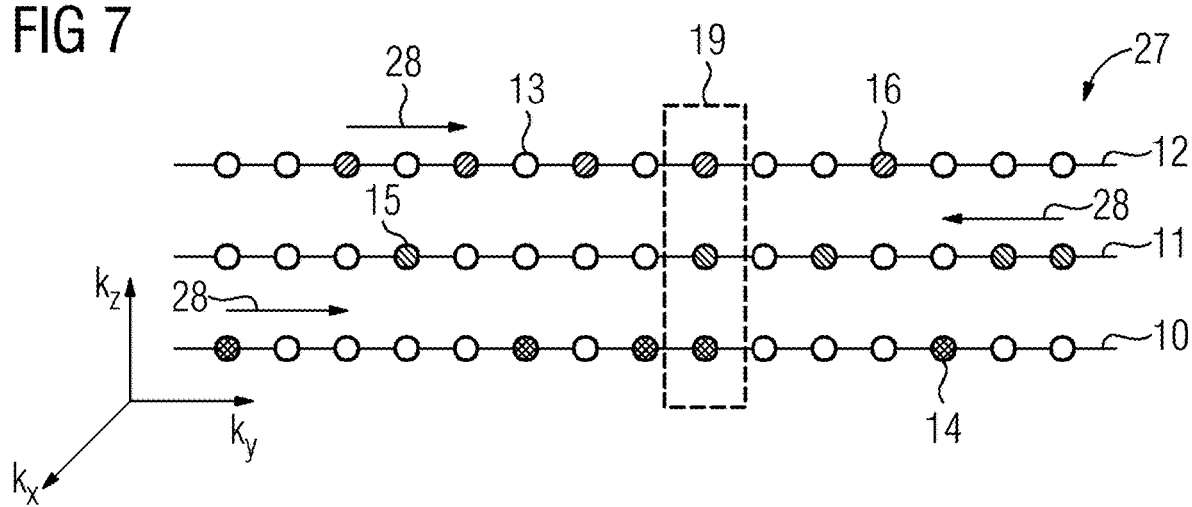
FIG. 7 illustrates an example of a randomized sampling scheme to reduce blurring effects.

As a further improvement, in particular to reduce blurring effects due to T2-decay when using a TSE imaging sequence, each echo train 14, 15, 16 may be sampled two times using a linear sampling from $-k_y$ to $+k_y$, wherein a respective sampling direction is switched for the respective second sampling to $+k_y$ to $-k_y$. Normally, this would have the disadvantage of a doubling of the acquisition time. The method proposed herein does, however, allow application of this technique without this increase in acquisition time. FIG. 7 schematically illustrates a corresponding randomized anti-blurring sampling scheme 27. Here, the different echo trains 14, 15, 16 are sampled in switching sampling directions 28 as indicated by corresponding arrows. The sampling direction 28 is switched after each of the echo trains.

While different sampling directions 28 are used for the different echo trains 14, 15, 16, the k-space center 19 is still sampled at the same time within each of the echo trains 14, 15, 16.

Because the described methods are used in SMS MRI, multiple slices of the patient 3 are excited at the same time. This means that a definite mapping between a respective $k_z$-coordinate—represented here as the three sets 10, 11, 12—and a respective slice is not possible. Rather, by imposing or impressing a respective phase, e.g., by applying the blipped gradient, a Fourier-encoding is created. This means that in the example of three slices values at $k_z=0$ (e.g., corresponding to the set 11) correlates to the sum of all three slices, and values at $k_z=-1$ and at $k_z=+1$ (e.g., corresponding to set 10 and set 12, respectively) correlate to the first frequencies of the Fourier-Transform.

Advantageously, the described methods may be used to increase a reduction in total acquisition time that may be achieved with 2D compressed sensing by an increased data incoherence. This may in particular be achieved through a reduction in the number of echo trains. In this manner, even scenarios where SMS MRI is used and thus no reduction of the repetition time is feasible may benefit from a reduced total acquisition time. For this purpose, a combination of a randomized blipping scheme and a compressed sensing reconstruction is applied to SMS MRI. In summary, the described examples show how a method for accelerated 2D compressed sensing using SMS MRI may be realized.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for two-dimensional (2D) magnetic resonance imaging of a subject, the method comprising:
acquiring an undersampled k-space dataset for the subject using a simultaneous multi-slice technique, wherein, to achieve an incoherent undersampling in at least one k-space direction, an encoding for selecting the respective k-space points to be sampled for the k-space dataset is created by applying a blipped phase-encoding gradient in a slice direction in a pseudo-random manner and/or by pseudo-randomly impressing a phase on radio-frequency (RF) pulses used in acquiring the k-space dataset; and performing a compressed sensing reconstruction based on the acquired undersampled k-space dataset to generate a magnetic resonance image of the subject, wherein the blipped phase-encoding gradient is varied in the slice direction within each echo train so that different echoes in a specific echo train are configured to sample k-space points from different k-space coordinates in the at least one k-space direction, and wherein, as a boundary condition for the incoherent undersampling, a k-space center is sampled at a same relative time within all of the echo trains.

2. A magnetic resonance imaging device comprising:

an imaging system configured to acquire an undersampled k-space dataset for a subject using a simultaneous multi-slice technique, wherein, to achieve an incoherent undersampling in at least one k-space direction, an encoding for selecting the respective k-space points to be sampled for the k-space dataset is created by applying a blipped phase-encoding gradient in a slice direction in a pseudo-random manner and/or by pseudo-randomly impressing a phase on radio-frequency (RF) pulses used in acquiring the k-space dataset; and a processor for processing the acquired undersampled k-space data by a compressed sensing reconstruction based on the acquired undersampled k-space dataset to generate a magnetic resonance image of the subject, wherein the blipped phase-encoding gradient is varied in the slice direction within each echo train so that different echoes in a specific echo train are configured to sample k-space points from different k-space coordinates in the at least one k-space direction, and wherein, as a boundary condition for the incoherent undersampling, a k-space center is sampled at a same relative time within all of the echo trains.

3. A non-transitory computer readable medium comprising instructions configured to cause a magnetic resonance imaging device to:

acquire an undersampled k-space dataset for a subject using a simultaneous multi-slice technique, wherein, to achieve an incoherent undersampling in at least one k-space direction, an encoding for selecting the respective k-space points to be sampled for the k-space dataset is created by applying a blipped phase-encoding gradient in a slice direction in a pseudo-random manner and/or by pseudo-randomly impressing a phase on radio-frequency (RF) pulses used in acquiring the k-space dataset; and perform a compressed sensing reconstruction based on the acquired undersampled k-space dataset to generate a magnetic resonance image of the subject, wherein the blipped phase-encoding gradient is varied in the slice direction within each echo train so that different echoes in a specific echo train are configured to sample k-space points from different k-space coordinates in the at least one k-space direction, and wherein, as a boundary condition for the incoherent undersampling, a k-space center is sampled at a same relative time within all of the echo trains.

4. The method of claim 1, wherein, as a boundary condition for the incoherent undersampling, a sampling probability is provided for k-space points in a the k-space center that is higher than for k-space points in a k-space periphery or closer to the k-space periphery that the k-space points in the k-space center.

5. The method of claim 4, wherein the undersampled k-space dataset is acquired using a GeneRalised Auto calibrating Partial Parallel Acquisition (GRAPPA) technique for parallel imaging, and wherein k-space data of the k-space points in the k-space center is used as reference data for the GRAPPA technique.

6. The method of claim 5, wherein, for the incoherent undersampling, different numbers of sampled k-space points are allowed for different coordinates in the at least one k-space direction.

7. The method of claim 1, wherein, for the incoherent undersampling, different numbers of sampled k-space points are allowed for different coordinates in the at least one k-space direction.

8. The method of claim 1, wherein multiple different image contrasts are acquired and the incoherent undersampling is also performed in a corresponding additional sampling dimension that depends on types of the different image contrasts.

9. The method of claim 8, wherein an echo time is used as the additional sampling dimension so that echo times are at least pseudo-randomized across the acquisitions of the different image contrasts.

10. The method of claim 9, wherein a Dixon technique is used, and wherein the additional sampling dimension is spanned by a phase state of different signals so that differently pseudo-randomized sampling patterns are used for in-phase echoes and out-of-phase echoes.

11. The method of claim 8, wherein a Dixon technique is used, and wherein the additional sampling dimension is spanned by a phase state of different signals so that differently pseudo-randomized sampling patterns are used for in-phase echoes and out-of-phase echoes.

* * * * *